United States Patent
Saito et al.

(10) Patent No.: US 10,686,317 B2
(45) Date of Patent: Jun. 16, 2020

(54) PROGRAMMABLE BATTERY PROTECTION SYSTEM AND RELATED METHODS

(71) Applicant: SEMICONDUCTOR COMPONENTS INDUSTRIES, LLC, Phoenix, AZ (US)

(72) Inventors: Hiroshi Saito, Ota (JP); Keiji Amemiya, Fukaya (JP); Mutsuki Niki, Saitama (JP); Yasuaki Hayashi, Oura-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/185,242

(22) Filed: Nov. 9, 2018

(65) Prior Publication Data

US 2019/0081491 A1  Mar. 14, 2019

Related U.S. Application Data

(62) Division of application No. 14/809,425, filed on Jul. 27, 2015, now Pat. No. 10,205,330.

(51) Int. Cl.
*H02J 7/00* (2006.01)

(52) U.S. Cl.
CPC ......... *H02J 7/0031* (2013.01); *H02J 7/00304* (2020.01)

(58) Field of Classification Search
CPC ... H01M 10/4257; H01M 2/348; H02J 7/0031
USPC .................. 320/134, 136; 307/10.7; 363/41
See application file for complete search history.

(56) References Cited

U.S. PATENT DOCUMENTS

| | | | |
|---|---|---|---|
| 5,838,076 A * | 11/1998 | Zarrabian | H03K 17/693 307/115 |
| 8,896,268 B2 | 11/2014 | Sakurai et al. | |
| 2003/0099075 A1 | 5/2003 | Pannwitz | |
| 2010/0052124 A1 | 3/2010 | Sasaki | |
| 2010/0052125 A1 | 3/2010 | Sasaki | |
| 2011/0309408 A1 | 12/2011 | Watanabe | |

(Continued)

FOREIGN PATENT DOCUMENTS

| | | |
|---|---|---|
| CN | 102064585 A | 5/2011 |
| CN | 102288810 A | 12/2011 |
| JP | 2001068614 A | 3/2001 |

(Continued)

*Primary Examiner* — Zixuan Zhou
(74) *Attorney, Agent, or Firm* — Adam R. Stephenson, Ltd.

(57) ABSTRACT

A programmable battery protection system. Implementations may include a battery protection integrated circuit (IC) with an array of fuses, a plurality of latches coupled with the array of fuses, a plurality of MOSFETs coupled with the plurality of latches, and a plurality of resistors coupled in series and in parallel with each one of the plurality of MOSFETs. The IC may also include a comparator coupled with the plurality of resistors and with a battery control circuit. Whether any one of the array of fuses is open or closed (remains closed) may be set by a fuse trimming signal from the battery control circuit. A voltage supplied to the comparator by the plurality of resistors during operation may be one of a discharge overcurrent threshold voltage, a charge overcurrent threshold voltage, or a short current threshold voltage.

20 Claims, 3 Drawing Sheets

(56) References Cited

U.S. PATENT DOCUMENTS

2012/0261825 A1  10/2012  Koike

FOREIGN PATENT DOCUMENTS

| | | |
|---|---|---|
| JP | 2001110986 A | 4/2001 |
| JP | 2001339869 A | 12/2001 |
| JP | 2007266218 A | 10/2007 |
| JP | 2008192959 A | 8/2008 |
| JP | 2009131020 A | 6/2009 |
| JP | 2009283507 A | 12/2009 |
| WO | 2010098501 A | 9/2010 |

* cited by examiner

PROGRAMMABLE BATTERY PROTECTION SYSTEM AND RELATED METHODS

CROSS REFERENCE TO RELATED APPLICATIONS

This application is a divisional application of the earlier U.S. Utility Patent Application to Hiroshi Saito entitled "Programmable Battery Protection System and Related Methods," application Ser. No. 14/809,425, filed Jul. 27, 2015, now pending, the disclosure of which is hereby incorporated entirely herein by reference.

BACKGROUND

1. Technical Field

Aspects of this document relate generally to battery system, such as battery packs for portable electronic devices.

2. Background Art

Battery systems have been devised to allow electronic devices to operate independent of power from a main power supply. Often, these take the form of a battery pack that contains control circuitry for the battery and which includes a set of leads which electrically couple the battery back to the electronic device. Examples of conventional systems and devices may be found in Japan Patent Application Publication No. P2008-192959A to Masanori Kobayashi, entitled "Semiconductor Integrated Circuit," filed Feb. 7, 2007 and published Aug. 21, 2008; Japanese Patent Application Publication No. P2009-131020A to Masatoshi Sugimoto, entitled "Over-Current Protecting Circuit and Battery Pack," filed Nov. 22, 2007 and published Jun. 11, 2009; and Japanese Patent Application Publication No. P2009-283507A to Yamaguchi et al. entitled "Voltage Setting Circuit, Method for Setting Voltage, Secondary Battery Protecting Circuit, and Semiconductor Integrated Circuit Device," filed May 19, 2008 and published Dec. 3, 2009; the disclosures of each of which are hereby incorporated entirely herein by reference.

SUMMARY

Implementations of programmable battery protection systems may include: a battery and only two field effect transistors (FETs) coupled with the battery where at least one of the FETs is configured for use during charging of the battery (charging FET) and at least one of the FETs is configured for use during discharging of the battery (discharging FET). The system may also include a battery protection integrated circuit (IC) coupled with the charging FET and with the discharging FET. The battery protection IC may include an array of fuses, a plurality of latches coupled with the array of fuses, and a plurality of metal oxide semiconductor field effect transistors (MOSFETs) coupled with the plurality of latches. The battery protection IC may also include a plurality of resistors coupled in series where each one of the plurality of resistors is coupled in parallel with each one of the plurality of MOSFETs and a comparator coupled with the plurality of resistors and with a battery control circuit. Whether any one of the array of fuses is open or closed (left closed) may be set by a fuse trimming signal from the battery control circuit. The fuse trimming signal may be a function of the on resistance of one of the charging FET, the discharging FET, or both the charging FET and discharging FET. A voltage supplied to the comparator by the plurality of resistors during operation may be one of a discharge overcurrent threshold voltage, a charge overcurrent threshold voltage, or a short current threshold voltage.

Implementations of programmable battery protection systems may include one, all, or any of the following:

The battery protection IC may be physically included in a semiconductor package as the charging FET and the discharging FET.

The charging FET and the discharging FET may be included on the same semiconductor chip.

The plurality of MOSFETs may be p-channel MOSFETs.

The plurality of latches may be gated D-latches.

The array of fuses may be polyfuses including polysilicon.

The array of fuses may be a Programmable Read Only Memory (PROM).

The array of fuses may be a One-Time Programmable (OTP) memory.

Implementations of a battery protection integrated circuit (IC) may include an array of fuses, a plurality of latches coupled with the array of fuses, a plurality of MOSFETs coupled with the plurality of latches, and a plurality of resistors coupled in series where each one of the plurality of resistors is coupled in parallel with each one of the plurality of MOSFETs. The IC may also include a comparator coupled with the plurality of resistors and with a battery control circuit. Whether any one of the array of fuses is open or closed (remains closed) may be set by a fuse trimming signal from the battery control circuit. A voltage supplied to the comparator by the plurality of resistors during operation may be one of a discharge overcurrent threshold voltage, a charge overcurrent threshold voltage, or a short current threshold voltage. The battery control circuit may be configured to be coupled with a battery and only two FETs.

Implementations of battery protection ICs may include one, all, or any of the following:

The only two FETs may further include where at least one of the FETs is configured for use during charging of a battery (charging FET) and at least one of the FETs is configured for use during discharging of the battery (discharging FET).

The battery protection IC may be physically included in the same semiconductor package as the charging FET and the discharging FET.

The charging FET and the discharging FET may be included on the same semiconductor chip.

The plurality of MOSFETs may be p-channel MOSFETs.

The plurality of latches may be gated D-latches.

The array of fuses may be polyfuses including polysilicon.

The array of fuses may be a Programmable Read Only Memory (PROM).

The array of fuses may be a One-Time Programmable (OTP) memory.

Implementations of programmable battery protection systems and battery protection ICs may utilize implementations of a method of providing a threshold voltage for a programmable battery protection system. The method may include measuring the on resistance of one of a charging FET, a discharging FET, or both a charging FET and a discharging FET where the charging FET and discharging FET are coupled with a battery and a battery protection IC. The method may also include calculating a threshold voltage using the on resistance using a battery protection circuit included in the battery protection IC and generating a fuse trimming signal using the threshold voltage using the battery protection circuit. The method may also include sending the fuse trimming signal to an array of fuses included in the battery protection IC and opening or leaving closed each fuse of the array of fuses using the fuse trimming signal. The method may also include reading a state of each fuse of the array of fuses into a latch of a plurality of latches coupled with the array of fuses and using a state of each latch of the plurality of latches to one of open or leave closed a MOSFET of a plurality of MOSFETs. Each of the plurality of MOSFETs may be coupled with each latch of the plurality of latches and each MOSFET may be coupled in parallel with a resistor of a plurality of resistors coupled in series. The method may also include changing a summed resistance of the plurality of resistors through opening or leaving closed each one of the plurality of MOSFETs and using the summed resistance, supplying a generated threshold voltage to a comparator included in a detector, where the detector is coupled with a battery protection circuit included in the battery protection IC. The method may also include separating a connection between the battery and one of a load or a charger using a detection signal received by the battery protection circuit from the detector using the generated threshold voltage.

Implementations of a method of providing a threshold voltage for a programmable battery protection system may include one, all, or any of the following:

The threshold voltage may be one of a discharge overcurrent threshold voltage value, a charge overcurrent threshold voltage value, or a short current threshold voltage value. The detector may be one of a discharge overcurrent detector, a charge overcurrent detector, or a short circuit detector.

Calculating the threshold voltage using the battery protection circuit and the on resistance may include calculating using one of a discharge overcurrent value, a charge overcurrent value, or a short current value.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended programmable battery protection systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such programmable battery protection systems, and implementing components and methods, consistent with the intended operation and methods.

Figure 3:
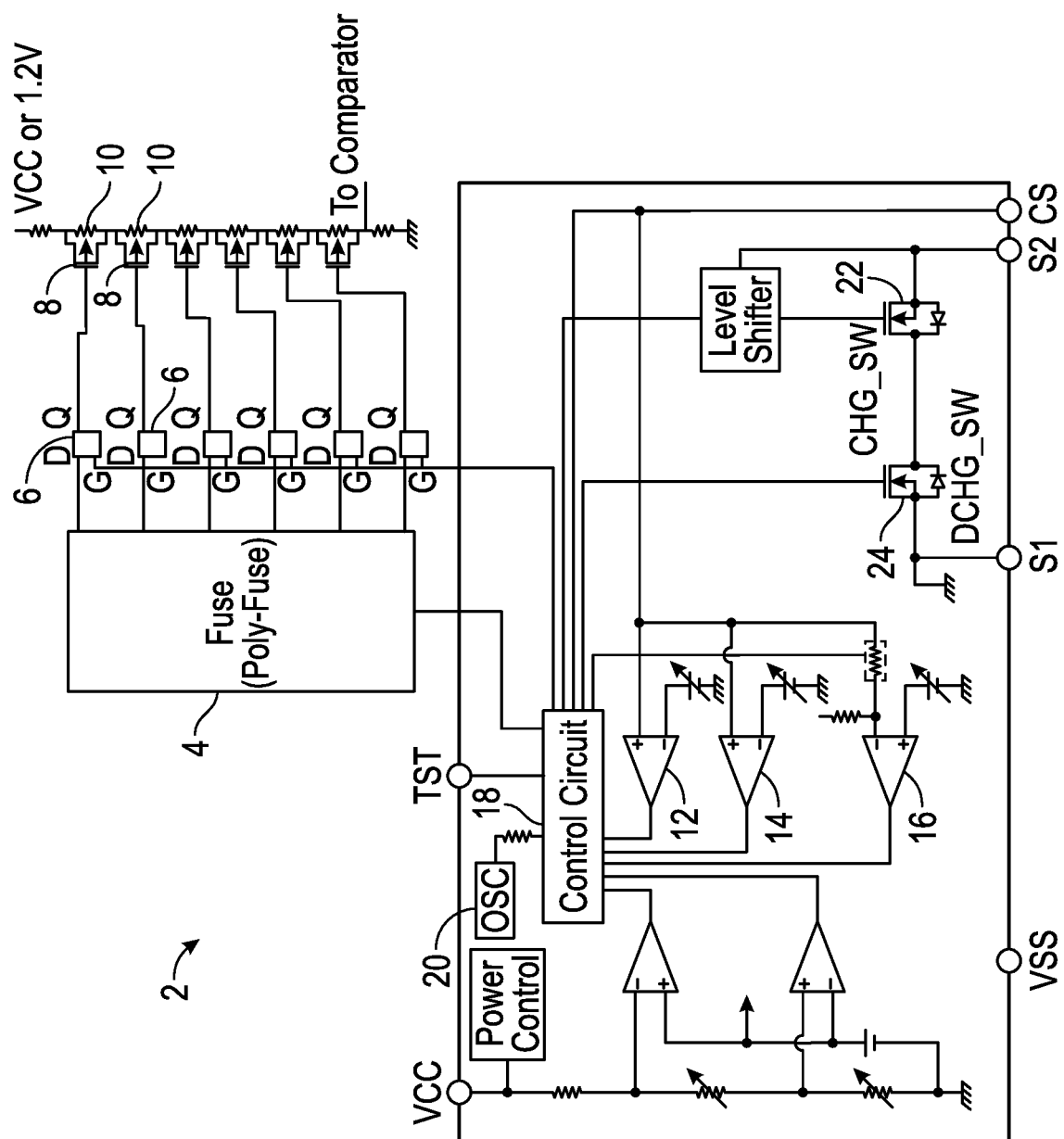
FIG. 3 is a circuit and block diagram view of a battery protection circuit included in a battery protection IC and included internal and external field effect transistors (FETs)

Referring to FIG. 3, an implementation of a battery control circuit 2 for use in a programmable battery protection system is illustrated. As illustrated, the battery control circuit 2 includes an array of fuses 4 coupled with a plurality of latches 6, and with a plurality of p-channel metal oxide semiconductor field effect transistors (MOSFETs) 8. The plurality of p-channel MOSFETs are each individually wired in parallel with a corresponding resistor 10 of a plurality of resistors that are coupled together in series. The output of the plurality of resistors is received by a comparator 12, 14, 16 and is the threshold (reference) voltage supplied to the comparator.

During operation, a voltage such as a bandgap voltage of about 1.2 V or the entire supply voltage from the battery is fed into the plurality of resistors 10. Based on whether the corresponding MOSFET 8 is open or closed, the current flows through the MOSFET 8. When current flows through the MOSFETs 8, this determines the ultimate summed resistance of the plurality of resistors 10 taking into account the rise and/or fall voltage characteristics of the MOSFETs 8. This summed resistance, in turn, according to Ohm's law, determines the final voltage output to the comparator 12, 14, 16, which is used by the comparator as a threshold (reference) voltage. Whether a particular p-channel MOSFET 8 is open or closed depends on whether a positive gate voltage is applied to the gate by a latch 6 of the plurality of latches. Whether each latch 6 has a stored voltage signal or the absence thereof is determined by whether the particular fuse 4 coupled to each latch is open or closed. In this way, as the latches 6, by design, are capable of maintain a voltage signal on the gates of the MOSFETs, the state (open/closed) of the fuses 4 need only be read once into the latches in various implementations. In various implementations, signals from an oscillator or clock 20 coupled to the battery control circuit 18 may be used to maintain the state of each of the plurality of latches 6 read from the fuse array 4.

Through the structure of the circuit illustrated in FIG. 3, the collective state of the array of fuses 4 can be used to encode a summed resistance value of the plurality of resistors 10, and, correspondingly, the threshold voltage applied to the comparator 12, 14, 16. Since each fuse 4 has only two states (open/closed) the array of fuses can be used to encode a binary value. In various implementations, this binary value stored in the fuse array 4 may initially be sent to the fuse array in serial form in the form of a trimming signal (fuse trimming signal), and additional circuitry may be employed to deserialize the data and assign it to the appropriate fuse for use in the trimming process. In so doing, the threshold voltage needed for the comparator may be effectively encoded in the array of fuses once the fuses have been trimmed by the trimming signal. The trimming signal is sent to the array of fuses from a battery control circuit 18 coupled to the fuse array 4.

A wide variety of circuit implementations and circuit component implementations are possible. In the implementation illustrated in FIG. 3, the plurality of latches are all gated D latches. In other implementations, however, other latch types could be employed, including, by non-limiting example, Earle latches, D flip-flops, JK flip-flops, gated SR latches, and any other latch type capable of holding a voltage on the gate of a MOSFET, including edge triggered latches. While p-channel MOSFETs are illustrated, n-channel or other MOSFET types could be used in various implementations. While the plurality of resistors are all illustrated as being arranged in series with the output of the comparator, in other implementations, one or more of the resistors could be arranged in parallel with the output to the comparator, creating a voltage divider circuit. The array of fuses can take several forms. In particular implementations, each fuse may be a polyfuse including of polysilicon. In various implementations, any of the fuse implementations disclosed in Japanese Patent Application Publication No. P2009-283507A to Yamaguchi et al. previously incorporated by reference, may be used in various implementations. Any number of two or more fuses in an array may be employed in various implementations. The array of fuses may form a programmable read only memory (PROM). In various implementations, the array of fuses may form a one-time programmable (OTP) memory.

The comparator 12, 14, 16 is part of or is a detector circuit that is used to detect an operating condition of a battery to which the battery protection system is coupled. In various implementations, the operating condition to be detected is an undesirable one, such as a battery discharge overcurrent condition, a battery charge overcurrent condition, or a battery short-circuit condition. Some of these conditions may damage the battery or create safety risks, particularly where the battery uses lithium ion technology. In various implementations, the voltage supplied to the comparator 12, 14, 16 is designed to allow the detector circuit to detect, one, all, or any of these conditions. In particular implementations, a separate detector circuit may be used to detect each of these conditions and send a detection signal to a battery control circuit that is capable of separating/breaking the connection between the battery and a load or charger (depending on the way the system is arranged) to prevent damage to the battery, load, charger, or all of these.

In various implementations, the same threshold voltage value may be supplied to all of the comparators 12, 14, 16 in the various detector circuits. In such implementations, only one array of fuses is needed, as the threshold voltage signal created by the latches, MOSFETs, and resistors can be provided for each comparator in each detector circuit. In other implementations, however, one or more of the detectors may require different threshold voltage from the others. In such implementations, more than one array of fuses may be employed. In other implementations, a single array of fuses may still be used but two or more sets of latches and two or more corresponding sets of resistors may be used to create two or more threshold voltages by reading out the states of different portions of the array of fuses into each set of latches.

The value of the threshold voltage may, in various implementations, be a strong function of one or more of the components in the battery protection integrated circuit 2. In the implementation illustrated in FIG. 3, the operating characteristics of the charging field effect transistor (FET) 22 and discharging FET 24, such as the on-resistance of either or both the charging FET and discharging FET, are the parameters that can be used to calculate the appropriate threshold voltage that corresponds with the existence of a discharge overcurrent, a charge overcurrent, or a short-circuit current being drawn from or input into the battery. In the system illustrated in FIG. 3, the charging and discharging FETs 22, 24 control the flow of current into and out of the battery itself, and so monitoring the inputs/output behavior of these devices permits the battery protection IC 2 to ensure that the undesirable condition does not exist. In particular implementations, both the charging and discharging FETs 22, 24 are activated during charging and discharging of the battery pack. In such implementations, an abnormal condition exists and would need to be detected by the detection circuits if only the charging FET 22 activated or if only the discharging FET 24 activated during charging or discharging. However, in other implementations, only the charging FET 22 may be activated during charging and the discharging FET 24 may be activated during discharging.

If the particular on resistances of the actual physical charging FET 22 and FET 24 in the battery protection IC 2 are known, then the threshold voltage(s) can be calculated given the particular over-discharge/under-discharge/short current specifications for the battery using various relationships, such as resistivity models or Ohm's law. Once these threshold voltage(s) have been calculated, the needed summed resistance to produce this voltage for of the plurality of resistors can be calculated with information regarding the available supply current and any relevant operating characteristics of the plurality of MOSFETs. For example, if the discharge overcurrent is 5 A, and the on resistance of both the discharge and charging FET is 10 milliohms, then, using Ohm's law, the discharge overcurrent threshold voltage would be 50 millivolts. Similarly, for the same discharge current of 5 A, on resistances of both the discharge and charging FET of 12 milliohms and 14 milliohms result in discharge overcurrent threshold voltages of 60 millivolts and 70 millivolts, respectively.

Using known values for the charge overcurrent, the discharge overcurrent, the shorting current, and the on-resistance of the charging FET/discharging FET or both the charging FET and discharging FET, the values of the charge overcurrent threshold voltage, the discharge overcurrent threshold voltage, and the short threshold voltage can be calculated. Additional comparators 16 and 14, respectively, receive these threshold voltages and feed a detection signal to the battery protection circuit 18. As previously discussed, if these threshold voltages differ from each other, then an additional fuse array and set of resistors may be employed (or multiple sets of latches/MOSFETs/resistors with a single fuse array).

Figure 4:
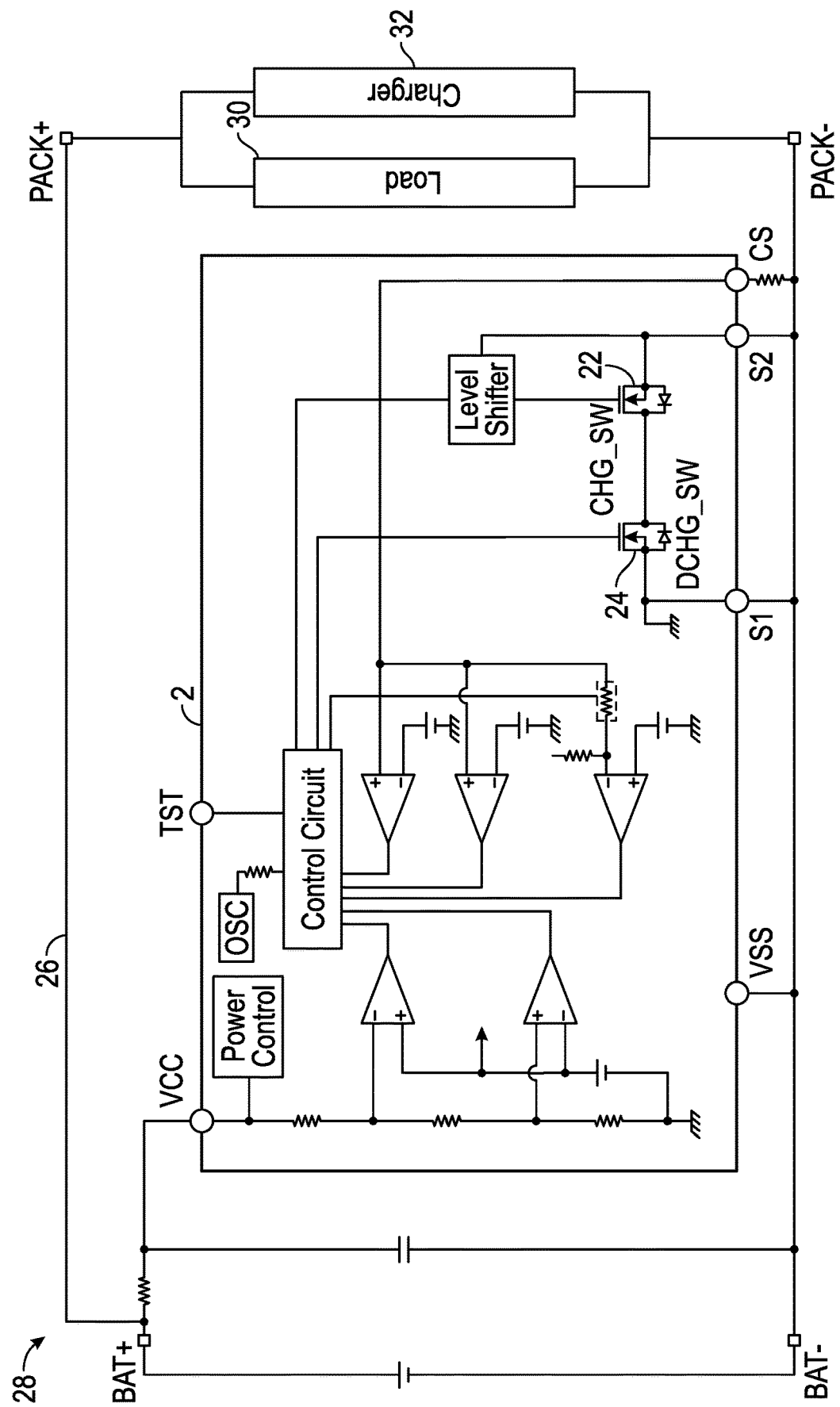
FIG. 4 is a circuit and block diagram of a battery and battery pack connected to a load and to a charger.

Referring to FIG. 4, during use, the battery protection IC 2 is incorporated into a battery pack 26 of a portable electronic device system 28. As illustrated, the system 28 can, at various times, include a load 30 and a charger 32. Depending on the characteristics of load 30, the charger 32 may be used concurrently with the load 30 or the load 30 and the charger 32 may be mutually exclusively used with the battery pack 26. The discharge FET 24 and the charging FET 22 are used to supply voltage and current to the load 30 and to receive voltage and current from the charger 32. Conventional battery pack systems have the discharge FET 24 and charging FET 22 mounted by themselves to a circuit board which contains contacts on a back side of the board that contact the battery cell(s) itself and contacts on a front side of the board that are designed to contact the load/charger. In particular implementations of battery protection ICs disclosed herein, the discharge FET 24 and the charging FET 22 may be included in the same semiconductor package and mounted at one location on the board of the battery pack 28.

Figure 1:
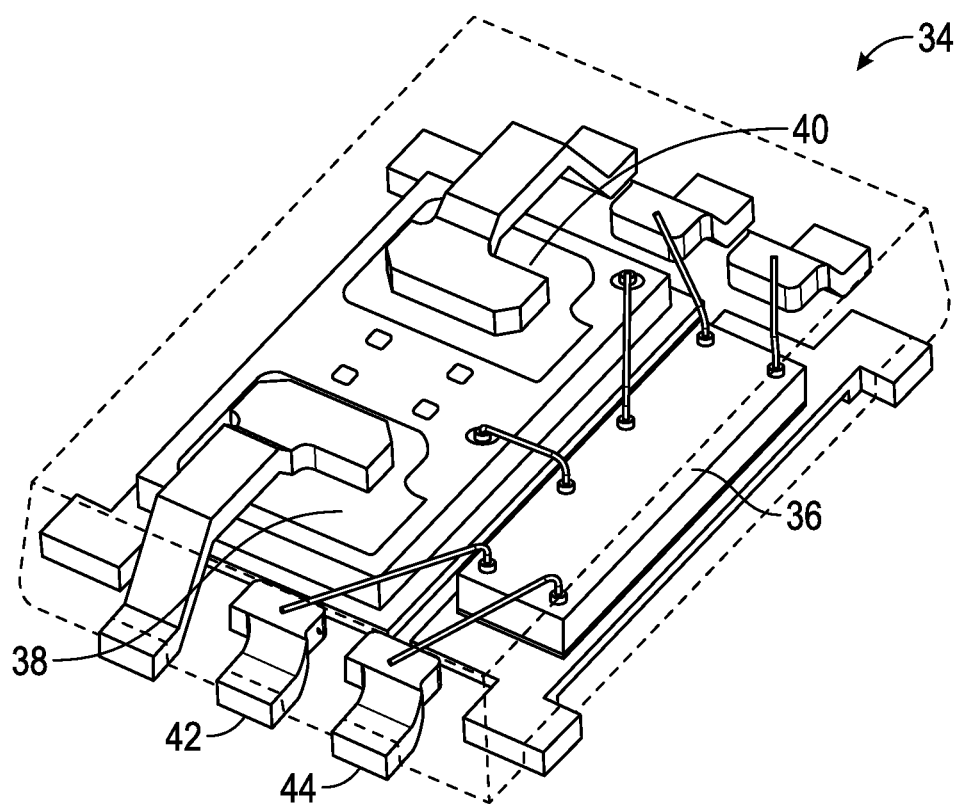
FIG. 1 is a see through view of a battery protection integrated circuit (IC)

Referring to FIG. 1, an implementation of a battery protection package 34 is illustrated. As illustrated, the mold compound of the package 34 is shown in see through so that the internal structure of the package 34 can be seen. As illustrated, a battery protection IC 36, the charging FET 40 and the discharge FET 38 are all included in the same package 34. While the battery protection IC 36 and the FETs 38, 40 have leadframes that are electrically isolated, the two chips are wire bonded together within the package 34 to allow the battery protection IC 36 to still control the operation of the FETs 38, 40. Various pins/leads may be included in the package 34 that electrically couple with the battery protection IC 36, including a current sense and testing pin 42 and a test (testing) pin 44. These pins interact with the board of the battery pack system. As can also be observed, the charging FET 40 and the discharge FET 38 are on the same chip, and were manufactured together on the same wafer. Accordingly, their on resistances may be very close in value to each other.

While FIG. 1 illustrates the battery protection IC 36 included in the same package as the charging and discharging FETs 40, 38, they could in various implementations be included in different packages as well.

Conventionally, the on resistance of the charging and discharging FETs used in battery packs is assumed to be exactly at the design specification. It has been discovered that the actual range of values on resistances of actual devices is in the range of 9.6 milliohms to 15.6 milliohms when a supply voltage of 3.7 V has been applied and the temperature of the devices is 25 C. This variation of about +/−25% of the midpoint of the range affects the ability of conventional detection circuitry to detect an overcurrent or short condition if the threshold voltages have been calculated using merely the design specification on resistance. This problem becomes particularly acute when the discharge current threshold voltage, charging current threshold voltage, and short current threshold voltage are a constant voltage value.

Figure 2:
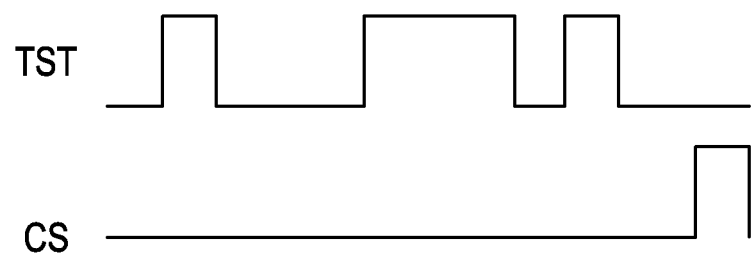
FIG. 2 is a diagram of a testing signal used to input trimming data to an array of fuses.

Implementations of battery protection ICs like those disclosed herein may utilize implementations of a method of providing a threshold (reference) voltage for a programmable battery protection system. Implementations of the method include, during application of a testing signal, measuring the on resistance of the charging FET and/or discharging FET and/or both the charging FET and discharging FET and calculating a threshold voltage using the on resistance using the battery protection circuit. The processing of calculating the threshold voltage may be any of those disclosed in this document and the threshold voltage may be any disclosed herein. With the calculated threshold voltage value, the battery protection circuit generates a fuse trimming signal and sends the fuse trimming signal to the array of fuses. Referring to FIG. 2, a graph of a testing signal (TST) and another testing signal (CS). As shown in FIG. 2, after measurement of the on resistance of a FET has been made, the testing signal (TST, CS) is used to convey the trimming signal to the fuse array. The fuse trimming signal is then used to open and leave closed those fuses corresponding with the received data in the trimming signal. These open and closed fused then change the comparator(s) threshold voltage(s) as described herein. The CS signal is used as an enable signal for the testing signal. The TST signal contains the serialized data used to trim the fuses. The CS pin is also used in various implementations for current sense signal detection while, in implementations, the TST pin has no further use during operation of the package after fuse trimming is completed.

The latches, using the clocking signal provided by the oscillator in various implementations, then read a state (open/closed) from each fuse and either change their state or remain closed as a result. A voltage is then applied to the gates of the plurality of MOSFETs that is a function of the states of the latches. The final summed resistance of the plurality of resistors is then established through the opening/closing of the various MOSFETs. The summed resistance is then used to supply the generated threshold voltage to a comparator included in a detector (detector circuit) and used as described herein. In the event the detector detects a deviation from the threshold voltage, a detection signal is sent to the battery protection circuit which takes action by separating a connection between the battery and the load and/or charger as needed to protect the battery.

Various method implementations permit the threshold voltage to be calculated at the time the battery pack is assembled and being prepared for shipping through measuring the actual on resistance of the charging and discharging FETs during a testing process. Since this is done after final assembly, the most accurate threshold voltage for each FET may be calculated. This threshold voltage generated during testing is based on the as-packaged and as-finally built values and will allow the battery protection IC to most accurately detect when a problem situation exists.

As disclosed herein, the method of programming or trimming the array of fuses takes place only once during the testing of the battery pack. Because the fuse array is a single write array (the fuses physically cannot be reclosed after being opened), it is not possible to reprogram or retrim the array of fuses after they have received the trimming signal.

Results of a comparison of conventional methods and systems for using the on resistance of the FET to control the battery pack performance and the systems and methods disclosed herein may be found in Table 1 below:

TABLE 1

| Parameter | Condition | Disclosed System | Conventional System |
|---|---|---|---|
| Total Impedance | — | 11 milliohms | 10.1 milliohms |
| Overcurrent Comparator Reference | — | Variable Voltage Capable | Constant Voltage Only |
| Current Monitoring | Discharge Overcurrent = 6.9 A | 6.2 A to 7.6 A (Δ = 1.4 A). | 5.1 A to 10.7 A (Δ = 5.6 A) |
| Discharge Current | Max Allowed | 7.6 A | 10.7 A |
| Discharge Current | Min Allowed | 6.2 A | 5.1 A |

By inspection it is clear that implementations of programmable battery protection systems like those disclosed herein can provide several times better detection and performance may keep the battery pack operating much closer to design current specifications. This may reduce damage short term and long term to the battery pack and may better ensure safe operation of the pack. The heat generated by operation at 10.7 A, for example, over the long term may damage and/or potentially create a hazardous condition with the battery pack if the battery protection system is unable to detect the condition.

In places where the description above refers to particular implementations of programmable battery protection systems and implementing components, sub-components, methods and sub-methods, it should be readily apparent that a number of modifications may be made without departing from the spirit thereof and that these implementations, implementing components, sub-components, methods and sub-methods may be applied to other programmable battery protection systems.

What is claimed is:

1. A method of providing a threshold voltage for a programmable battery protection system, the method comprising:

measuring on resistance of one of a charging field effect transistor (FET), a discharging FET, or both the charging FET and the discharging FET, the charging FET and discharging FET configured to couple with a battery and a battery protection integrated circuit (IC);

calculating using the battery protection IC, the threshold voltage using the on resistance;

using a fuse trimming signal generated based on the threshold voltage, opening or leaving closed each fuse of an array of fuses;

reading a state of each fuse of the array of fuses into a latch of a plurality of latches coupled with the array of fuses;

using a state of each latch of the plurality of latches to one of open or leave closed a metal oxide semiconductor field effect transistor (MOSFET) of a plurality of MOSFETs, each of the plurality of MOSFETs coupled with each latch of the plurality of latches, each MOSFET coupled in parallel with a resistor of a plurality of resistors coupled in series;

supplying a generated threshold voltage to a comparator comprised in a detector, the detector coupled with the battery protection IC; and separating a connection between the battery and one of a load or a charger using a detection signal received by the battery protection IC from the detector using the generated threshold voltage.

2. The method of claim 1, wherein the threshold voltage is one of a discharge overcurrent threshold voltage value, a charge overcurrent threshold voltage value, or a short current threshold voltage value and the detector is one of a discharge overcurrent detector, a charge overcurrent detector, or a short circuit detector.

3. The method of claim 2, wherein calculating the threshold voltage using the battery protection IC and the on resistance includes calculating using one of a discharge overcurrent value, a charge overcurrent value, or a short current value.

4. The method of claim 1, wherein the battery protection IC is physically comprised in a same semiconductor package as the charging FET and the discharging FET.

5. The method of claim 1, wherein the charging FET and the discharging FET are comprised on the same semiconductor chip.

6. The method of claim 1, wherein the plurality of MOSFETs are p-channel MOSFETs.

7. The method of claim 1, wherein the plurality of latches are gated D-latches.

8. The method of claim 1, wherein the array of fuses are polyfuses comprising polysilicon.

9. The method of claim 1, wherein the array of fuses are a Programmable Read Only Memory (PROM).

10. The method of claim 1, wherein the array of fuses are a One-Time Programmable (OTP) memory.

11. A method of providing a threshold voltage for a programmable battery protection system, the method comprising:

measuring on resistance of one of a charging field effect transistor (FET), a discharging FET, or both the charging FET and the discharging FET, the charging FET and discharging FET coupled with a battery and a battery protection integrated circuit (IC);

calculating using a battery protection circuit comprised in the battery protection IC, the threshold voltage using the on resistance;

generating using the battery protection circuit, a fuse trimming signal using the threshold voltage;

sending the fuse trimming signal to an array of fuses comprised in the battery protection IC and opening or leaving closed each fuse of the array of fuses using the fuse trimming signal;

reading a state of each fuse of the array of fuses into a latch of a plurality of latches coupled with the array of fuses;

using a state of each latch of the plurality of latches to one of open or leave closed a metal oxide semiconductor field effect transistor (MOSFET) of a plurality of MOSFETs, each of the plurality of MOSFETs coupled with each latch of the plurality of latches, each MOSFET coupled in parallel with a resistor of a plurality of resistors coupled in series;

changing a summed resistance of the plurality of resistors through one of opening or leaving closed each one of the plurality of MOSFETs;

using the summed resistance, supplying a generated threshold voltage to a comparator comprised in a detector, the detector coupled with a battery protection circuit comprised in the battery protection IC; and separating a connection between the battery and one of a load and a charger using a detection signal received by the battery protection circuit from the detector using the generated threshold voltage.

12. The method of claim 11, wherein the threshold voltage is one of a discharge overcurrent threshold voltage value, a charge overcurrent threshold voltage value, or a short current threshold voltage value and the detector is one of a discharge overcurrent detector, a charge overcurrent detector, or a short circuit detector.

13. The method of claim 12, wherein calculating the threshold voltage using the battery protection circuit and the on resistance includes calculating using one of a discharge overcurrent value, a charge overcurrent value, or a short current value.

14. The method of claim 11, wherein the battery protection circuit is physically comprised in a same semiconductor package as the charging FET and the discharging FET.

15. The method of claim 11, wherein the charging FET and the discharging FET are comprised on the same semiconductor chip.

16. The method of claim 11, wherein the plurality of MOSFETs are p-channel MOSFETs.

17. The method of claim 11, wherein the plurality of latches are gated D-latches.

18. The method of claim 11, wherein the array of fuses are polyfuses comprising polysilicon.

19. The method of claim 11, wherein the array of fuses are a Programmable Read Only Memory (PROM).

20. The method of claim 11, wherein the array of fuses are a One-Time Programmable (OTP) memory.

* * * * *